(12) United States Patent
Kim et al.

(10) Patent No.: US 11,513,888 B2
(45) Date of Patent: Nov. 29, 2022

(54) DATA PROCESSING DEVICE

(71) Applicant: SK hynix Inc., Gyeonggi-do (KR)

(72) Inventors: Dae Sung Kim, Gyeonggi-do (KR); Bo Seok Jeong, Incheon (KR); Soon Young Kang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 287 days.

(21) Appl. No.: 16/543,690

(22) Filed: Aug. 19, 2019

(65) Prior Publication Data

US 2020/0210274 A1 Jul. 2, 2020

(30) Foreign Application Priority Data

Dec. 28, 2018 (KR) .................. 10-2018-0171648

(51) Int. Cl.
*G06F 11/08* (2006.01)
*H03M 13/45* (2006.01)
*H03M 13/37* (2006.01)
*G06F 11/10* (2006.01)
*H03M 13/29* (2006.01)
*H03M 13/11* (2006.01)
*G06F 3/06* (2006.01)
*G11C 29/52* (2006.01)

(52) U.S. Cl.
CPC .......... *G06F 11/08* (2013.01); *H03M 13/3746* (2013.01); *H03M 13/458* (2013.01); *G06F 3/0679* (2013.01); *G06F 11/10* (2013.01); *G11C 29/52* (2013.01); *H03M 13/1108* (2013.01); *H03M 13/1111* (2013.01); *H03M 13/1131* (2013.01); *H03M 13/2906* (2013.01)

(58) Field of Classification Search
CPC .......... H03M 13/1108; H03M 13/1111; H03M 13/458; H03M 13/1131; H03M 13/2906; H03M 13/3746; G06F 11/10; G06F 11/08; G06F 3/0679; G11C 29/52
See application file for complete search history.

(56) References Cited

U.S. PATENT DOCUMENTS

| | | | | |
|---|---|---|---|---|
| 9,009,578 B1* | 4/2015 | Varnica | ............. | H03M 13/1108 |
| | | | | 714/785 |
| 2005/0257116 A1* | 11/2005 | Zarrinkhat | ......... | H03M 13/1111 |
| | | | | 714/755 |
| 2017/0063400 A1* | 3/2017 | Zhang | ................ | G06F 11/1012 |
| 2018/0175889 A1* | 6/2018 | Bazarsky | .......... | H03M 13/6325 |

FOREIGN PATENT DOCUMENTS

KR 101753714 7/2017

* cited by examiner

*Primary Examiner* — April Y Blair
*Assistant Examiner* — Sazzad Hossain
(74) *Attorney, Agent, or Firm* — IP & T Group LLP

(57) ABSTRACT

A data processing device includes a plurality of variable nodes configured to receive and store a plurality of target bits; a plurality of check nodes each configured to receive stored target bits from one or more corresponding variable nodes of the plurality of variable nodes, check whether received target bits have an error bit, and transmit a check result to the corresponding variable nodes; and a group state value manager configured to determine group state values of variable node groups into which the plurality of variable nodes are grouped.

18 Claims, 14 Drawing Sheets

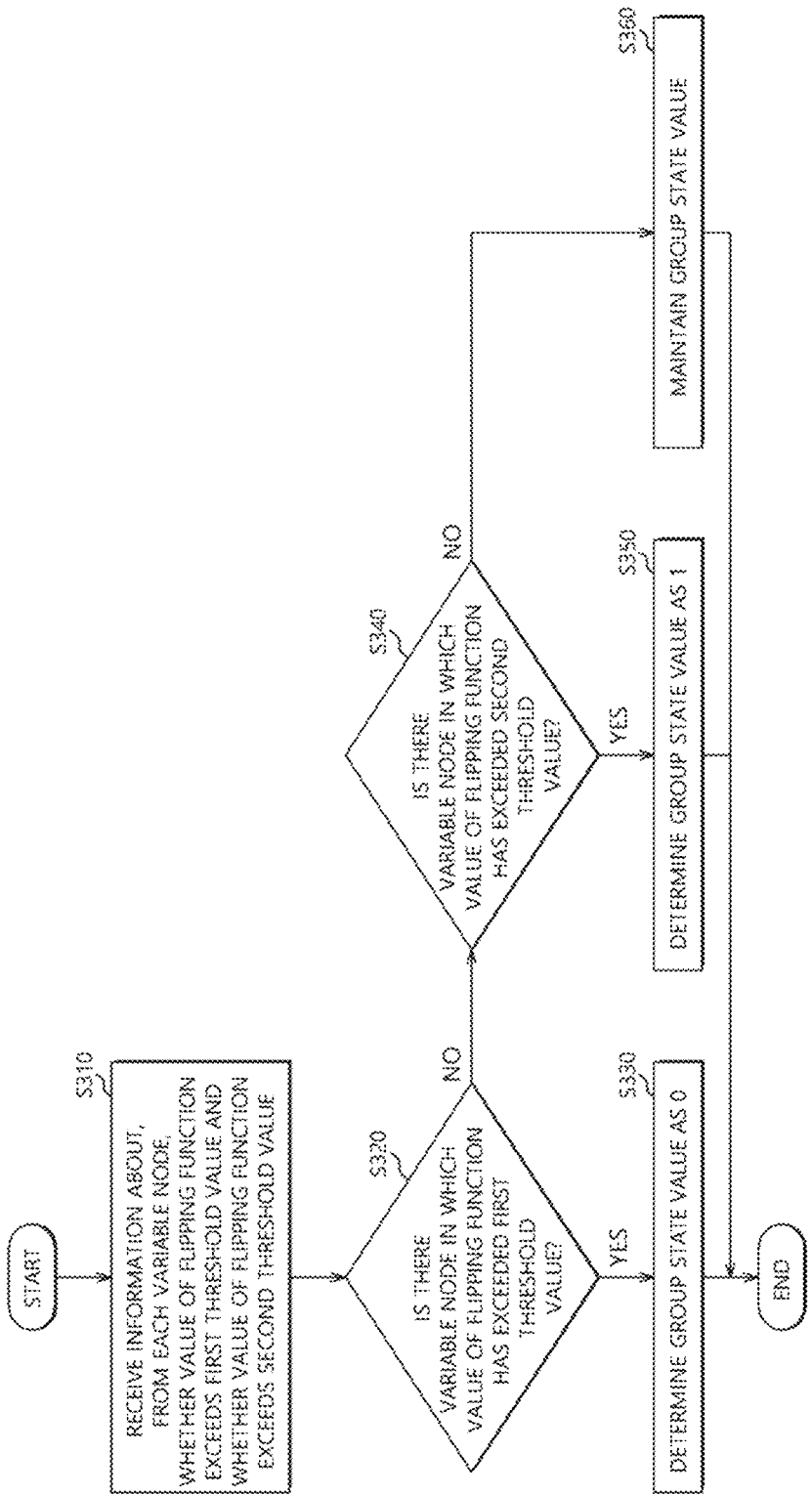

DATA PROCESSING DEVICE

CROSS-REFERENCES TO RELATED APPLICATION

The present application claims priority under 35 U.S.C. § 119(a) to Korean application number 10-2018-0171648, filed on Dec. 28, 2018, which is incorporated herein by reference in its entirety.

BACKGROUND

1. Technical Field

Various embodiments generally relate to a data processing device, and more particularly, to a data processing device for correcting an error bit in a memory system.

2. Related Art

A memory system may be configured to store data provided from a host device in response to a write request of the host device. Furthermore, the memory system may be configured to provide the host device with the stored data in response to a read request of the host device. The host device is an electronic device capable of processing data such as a computer, a digital camera, a cellular phone and the like. The memory system may be embedded in the host device to operate, or may be manufactured in a detachable form and be electrically connected to the host device.

SUMMARY

A data processing device with reduced memory capacity and power consumption is described herein.

In an embodiment, a data processing device may include: a plurality of variable nodes configured to receive and store a plurality of target bits; a plurality of check nodes each configured to receive stored target bits from one or more corresponding variable nodes of the plurality of variable nodes, check whether received target bits have an error bit, and transmit a check result to the corresponding variable nodes; and a group state value manager configured to determine group state values of variable node groups into which the plurality of variable nodes are grouped, wherein each of the plurality of variable nodes repeats an iteration including selective flipping of a stored target bit on the basis of a previous group state value determined for a corresponding variable node group in a previous iteration and check results of one or more corresponding check nodes of the plurality of check nodes, and ends a current iteration by outputting the stored target bit when the check results indicate that the received target bits do not have the error bit among the corresponding check nodes, and in the current iteration, the group state value manager updates the previous group state value after the stored target bit is selectively flipped.

In an embodiment, a data processing device may include: a plurality of variable nodes configured to receive and store a plurality of target bits, respectively; a plurality of check nodes each configured to receive stored target bits from one or more corresponding variable nodes of the plurality of variable nodes, check whether received target bits have an error bit, and transmit a check result to the corresponding variable nodes; and a group state value memory configured to store group state values of variable node groups into which the plurality of variable nodes are grouped, wherein each of the plurality of variable nodes selectively flips a stored target bit on the basis of a group state value of a corresponding variable node group and check results of one or more corresponding check nodes of the plurality of check nodes.

In an embodiment, an operating method of a controller may include: providing, by each of variable nodes, a codeword bit, which is provided from a memory device, to one or more corresponding to the variable node among check nodes; detecting, by each of the check nodes, an error of the codeword bit provided thereto; selectively flipping, by each of the variable nodes, the codeword bit according to a group state value and a flipping function of the codeword bit and the detection result of the corresponding check nodes; updating the group state value according to the flipping functions of the variable nodes; iterating the providing of the codeword bit, detecting the error of the codeword bit, selectively flipping the codeword bit, and updating the group state value for a predetermined number of times until no error is detected within the codeword bits; and providing a host with the codeword bits as error-corrected data bits when no error is detected within the codeword bits.

In accordance with the embodiments, the data processing device may operate with reduced memory capacity and power consumption.

BRIEF DESCRIPTION OF THE DRAWINGS

FIG. 8A and FIG. 8B are flowcharts illustrating a method in which the group state value manager of FIG. 4A determines a group state value in accordance with an embodiment.

DETAILED DESCRIPTION

Figure 1:
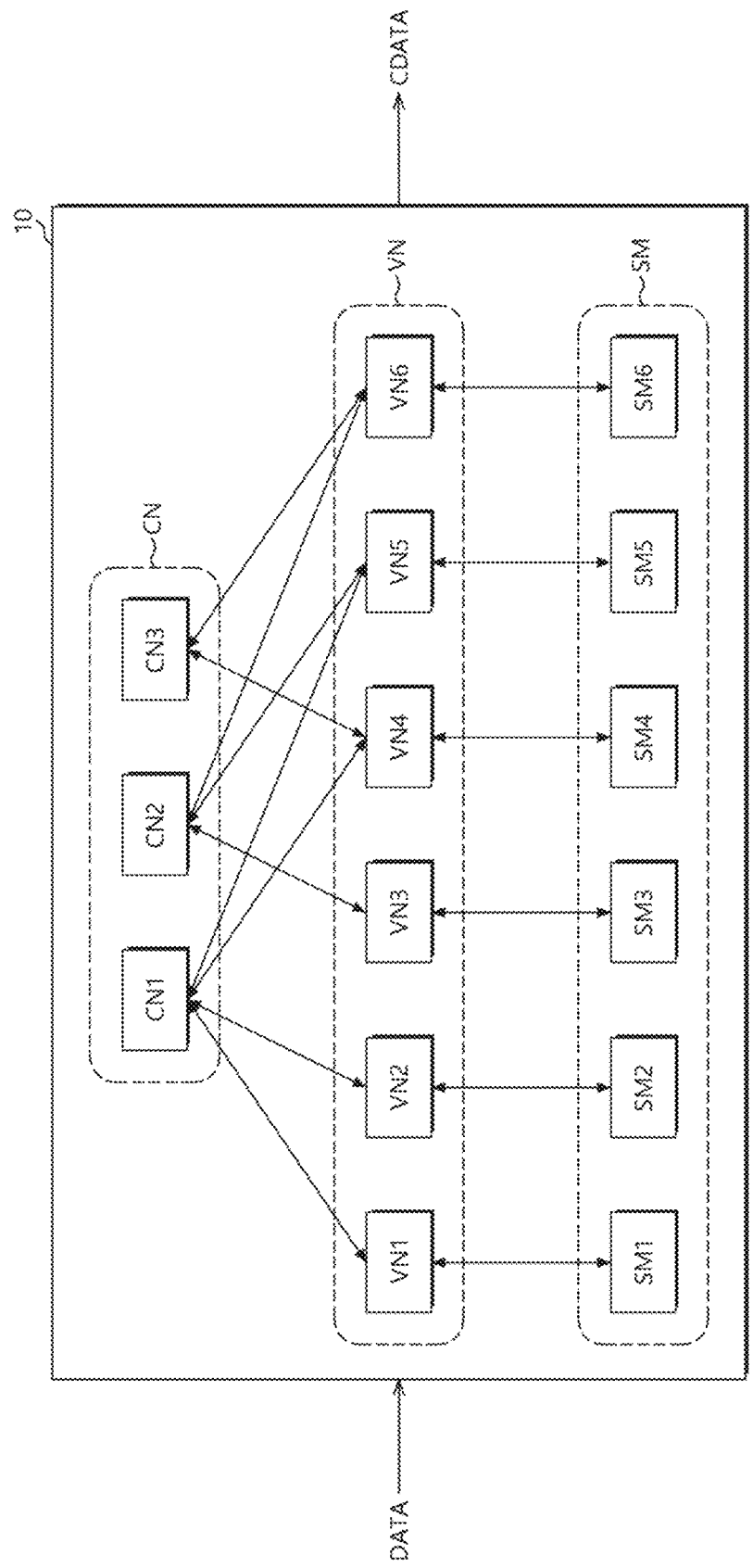
FIG. 1 is a block diagram illustrating a data processing device in accordance with an embodiment.

In the present invention disclosure, advantages, features and methods for achieving them will become more apparent after a reading of the following embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. The articles 'a' and 'an' as used in this application and the appended claims should generally be construed to mean 'one or more' unless specified otherwise or clear from context to be directed to a singular form. It will be further understood that the terms "includes" and/or "including," when used in this specification, specify the presence of at least one stated feature, step, operation, and/or element, but do not preclude the presence or addition of one or more other features, steps, operations, and/or elements thereof.

It is noted that reference to "an embodiment," "another embodiment" or the like does not necessarily mean only one embodiment, and different references to any such phrase are not necessarily to the same embodiment(s).

Hereinafter, embodiments will be described in detail with reference to the drawings.

FIG. 1 is a block diagram illustrating a data processing device 10 in accordance with an embodiment.

Referring to FIG. 1, the data processing device 10 may receive data DATA including a plurality of bits from an exterior, perform an error correction operation on the data DATA, and output error-corrected data CDATA. The data processing device 10, for example, may be configured on the basis of an LDPC code algorithm or a bit flipping algorithm; however, the data processing device 10 may be configured on the basis of various other error correction algorithms in accordance with various embodiments.

The data processing device 10 may include variable nodes VN, check nodes CN, and state value memories SM.

Although the embodiment of FIG. 1 shows, as an example, three check nodes CN1 to CN3, six variable nodes VN1 to VN6, and six state value memories SM1 to SM6, this disclosure is not limited thereto. That is, the number of the check nodes CN, the variable nodes VN, and the state value memories SM may vary depending on design.

Each of the variable nodes VN may be electrically or logically connected to one or more check nodes selected from the check nodes CN, that is, corresponding check nodes on the basis of an error correction algorithm applied to the data processing device 10. Furthermore, each of the variable nodes VN may be electrically or logically connected to a corresponding state value memory of the state value memories SM. For example, a variable node VN4 may be electrically or logically connected to corresponding check nodes CN1 and CN3, and may be electrically or logically connected to a corresponding state value memory SM4.

Each of the variable nodes VN may receive and store a corresponding bit included in the data DATA as its own target bit, and perform an error correction operation on the stored target bit.

In an embodiment, each of the variable nodes VN may transmit its own target bit to corresponding check nodes, and count unsatisfied check nodes of the corresponding check nodes. The unsatisfied check nodes may be check nodes in which an error bit exists in the target bits of corresponding variable nodes, as will be described below with reference to FIG. 2.

Furthermore, on the basis of the state value stored in a corresponding state value memory and the number of unsatisfied check nodes, each of the variable nodes VN may flip its own target bit and determine (that is, update) the state value of the state value memory. A specific method in which each of the variable nodes VN flips its own target bit and changes the state value will be described in detail with reference to FIG. 3.

Each of the check nodes CN may be electrically or logically connected to one or more variable nodes selected from the variable nodes VN, that is, corresponding variable nodes, on the basis of the error correction algorithm applied to the data processing device 10. For example, the check node CN1 may be electrically or logically connected to corresponding variable nodes VN1, VN2, VN4, and VN5.

Each of the check nodes CN may receive one or more corresponding target bits from corresponding variable nodes, check whether the corresponding target bits have an error bit, and transmit a check result to the corresponding variable nodes.

In an embodiment, when the value sum of the received target bits is 0, each of the check nodes CN may determine that the target bits have no error bit. On the other hand, when the value sum of the received target bits is not 0, each of the check nodes CN may determine that the target bits have the error bit. In accordance with an embodiment, determining whether the value sum of the target bits is 0 may include determining whether the number of 1's in the target bits is an even number. A specific method in which each of the check nodes CN checks the target bits will be described in detail with reference to FIG. 2.

The state value memories SM may be electrically or logically connected to the variable nodes VN, respectively. Each of the state value memories SM may store a state value to be referred to and changed by a corresponding variable node. The state value may indicate whether the target bit of the corresponding variable node is reliable. For example, the state value may indicate a reliability value. The reliability of the target bit indicated by the state value may indicate a possibility that the target bit is not an error bit.

For example, when the state value is a first value, for example, 0, it may indicate that a corresponding target bit is reliable. When the state value is a second value, for example, 1, it may indicate that a corresponding target bit is not reliable. In accordance with an embodiment, a method of indicating the reliability of a target bit with a state value is not limited thereto. In accordance with an embodiment, each state value may be composed of two bits or more.

In accordance with an embodiment, when target bits are inputted to the variable nodes VN, initial state values stored in the state value memories SM may be first values, that is, 0's.

In accordance with an embodiment, the state value memories SM may be located in one memory apparatus.

In accordance with an embodiment, the state value memories SM may be included in corresponding variable nodes, respectively.

A procedure, in which each of the variable nodes VN transmits its own target bit to corresponding check nodes, flips the target bit on the basis of the current state value and the check results of the corresponding check nodes, and changes the state value may constitute a single iteration of an error correction operation. After the single iteration is performed, the variable nodes VN may perform a subsequent iteration in the same way. The variable nodes VN may repeat the iteration until the check nodes CN determine that target bits have no error bit.

Figure 2:
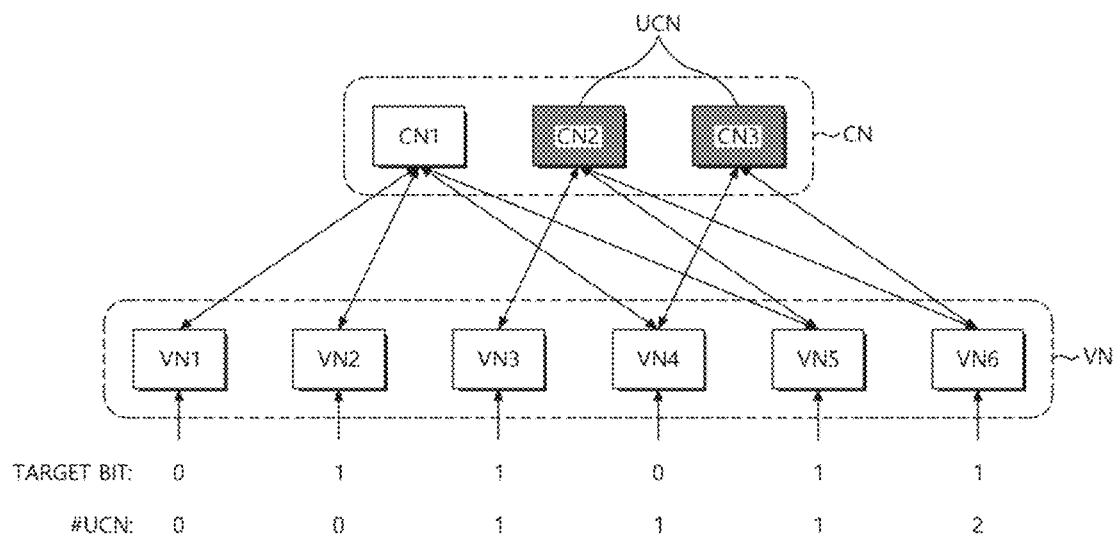
FIG. 2 is diagram illustrating a method in which check nodes of FIG. 1 check target bits in accordance with an embodiment.

FIG. 2 is a diagram illustrating a method in which the check nodes CN of FIG. 1 check target bits in accordance with an embodiment.

Referring to FIG. 2, the variable nodes VN may receive corresponding target bits, respectively.

Each of the variable nodes VN may transmit its own target bit to one or more corresponding check nodes.

Each of the check nodes CN may receive target bits from one or more corresponding variable nodes. Each of the check nodes CN may determine whether the value sum of the received target bits is 0.

For example, the check node CN1 may determine that the value sum of the target bits transmitted from the variable nodes VN1, VN2, VN4, and VN5 is 0. However, a check node CN2 may determine that the value sum of the target bits transmitted from variable nodes VN3, VN5, and VN6 is not 0. Furthermore, the check node CN3 may determine that the value sum of the target bits transmitted from the variable nodes VN4 and VN6 is not 0. Accordingly, the check nodes CN2 and CN3 may be check nodes having determined that the target bits have an error bit and may be unsatisfied check nodes UCN.

Each of the variable nodes VN may receive a check result from corresponding check nodes and count unsatisfied check nodes UCN electrically or logically connected to thereto. In the embodiment of FIG. 2, the number of unsatisfied check nodes #UCN counted by each of the variable nodes VN is illustrated for reference.

Figure 3:
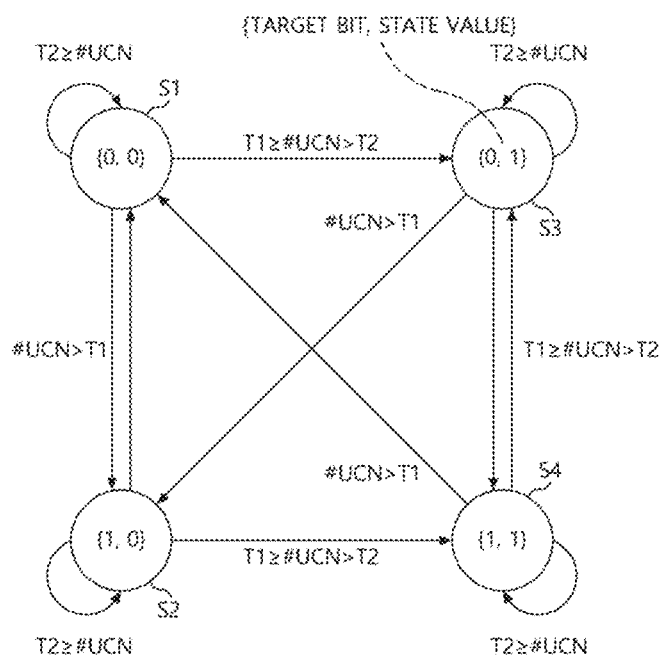
FIG. 3 is a diagram for explaining a method in which each variable node of FIG. 1 flips a target bit and changes a state value in accordance with an embodiment.

FIG. 3 is a diagram for explaining a method in which each of the variable nodes VN of FIG. 1 flips a target bit and changes a state value in accordance with an embodiment. With reference to FIG. 3, an operation method of an arbitrary variable node of the variable nodes VN will be described, and the variable nodes VN may operate in the same manner as the operation method.

Referring to FIG. 3, first to fourth states S1 to S4 may indicate possible combinations of the target bits of the variable nodes and state values. The first to fourth states S1 to S4 may be cases where sets of {target bits, state values} are {0, 0}, {1 0}, {0, 1}, and {1, 1}. Each of the variable nodes VN may be placed in any one of the first to fourth states S1 to S4 by flipping the target bit according to the state value stored in its own state value memory and the number of unsatisfied check nodes #UCN and changing the state value.

For example, when the state value is 0 and the number of unsatisfied check nodes #UCN exceeds a first threshold value T1, each variable node may flip the target bit and maintain the state value to the current value. This case may result in a transition between the first state S1 and the second state S2.

Furthermore, when the state value is 0 and the number of unsatisfied check nodes #UCN exceeds a second threshold value T2 and is substantially equal to or less than the first threshold value T1, each variable node may change the state value without flipping the target bit. This case may result in a transition from the first state S1 to the third state S3 or a transition from the second state S2 to the fourth state S4.

Furthermore, when the state value is 0 and the number of unsatisfied check nodes #UCN is substantially equal to or less than the second threshold value T2, each variable node may maintain the target bit and the state value to the current value. This case may result in the maintaining of the first state S1 or the maintaining of the second state S2.

Furthermore, when the state value is 1 and the number of unsatisfied check nodes #UCN exceeds the first threshold value T1, each variable node may flip the target bit and change the state value. This case may result in a transition from the third state S3 to the second state S2 or a transition from the fourth state S4 to the first state S1.

Furthermore, when the state value is 1 and the number of unsatisfied check nodes #UCN exceeds the second threshold value T2 and is substantially equal to or less than the first threshold value T1, each variable node may flip the target bit and maintain the state value to the current value. This case may result in a transition between the third state S3 and the fourth state S4.

Furthermore, when the state value is 1 and the number of unsatisfied check nodes #UCN is substantially equal to or less than the second threshold value T2, each variable node may maintain the target bit and the state value to the current value. This case may result in the maintaining of the third state S3 or the maintaining of the fourth state S4.

That is, when the number #UCN of unsatisfied check nodes UCN of a certain variable node is high, it may indicate that the target bit of the variable node is highly likely to be an error bit. Accordingly, each variable node may flip, that is, correct its own target bit by identifying the reliability of the target bit through the state value and comparing the number of unsatisfied check nodes #UCN with the first threshold value T1 and the second threshold value T2. The first threshold value T1 and the second threshold value T2 may be predetermined or selected appropriately depending on design.

In accordance with an embodiment, each of the variable nodes VN may flip its own target bit on the basis of the state value transmitted from its own state value memory and the value of a flipping function. The value of the flipping function may be different for each variable node VN. A value E1 of the flipping function of a certain variable node may be determined on the basis of Equation 1 below.

$$E1 = a11*(r \oplus c) + a12*\#UCN + a13*\#SCN \quad \text{[Equation 1]}$$

In Equation 1 above, the constants a11, a12, and a13 may be different from one another for each variable node VN.

Furthermore, the constants a11, a12, and a13 may be changed according to the number of check nodes electrically or logically connected to a variable node and the number of iterations repeated up to now. The constants a11, a12, and a13 may be predetermined or selected from values through experiments.

In Equation 1 above, the value r may indicate a target bit initially inputted to the variable node.

In Equation 1 above, the value c may be a value of the target bit of the variable node corrected in an immediately previous iteration.

In Equation 1 above, the operation ⊕ may be an exclusive OR operation.

In Equation 1 above, #UCN may be the number of unsatisfied check nodes counted by the variable node in the current iteration.

In Equation 1 above, #SCN may be the number of check nodes, other than the unsatisfied check nodes among check nodes electrically or logically connected to the variable node, that is, satisfied check nodes, counted by the variable node in the current iteration.

A method of using the value E1 of the flipping function calculated according to Equation 1 above when each of the variable nodes VN flips the target bit may be the same as that of using the number #UCN of unsatisfied check nodes UCN described in FIG. 3. The number #UCN of unsatisfied check nodes UCN illustrated in FIG. 3 may be an embodiment of the value E1 of the flipping function. That is, when the constant a11 is 0 and the constant a12 is 1, each of the variable nodes VN may use the number #UCN of unsatisfied check nodes UCN as the value E1 of the flipping function. Accordingly, a detailed description thereof will be omitted.

In accordance with an embodiment, the flipping function is not limited to Equation 1 above.

Referring back to FIG. 1, each of the variable nodes VN may refer to its own state value in order to flip its own target bit. In accordance with an embodiment to be described below, the variable nodes VN may share one state value, that is, a group state value. That is, the variable nodes VN may flip their own target bits by referring to one group state value in common. The group state value may be changed according to whether the variable nodes VN have flipped their own target bits. As a result, the memory capacity for storing the state value can be greatly reduced, resulting in a reduction of power consumption.

Figure 4A:
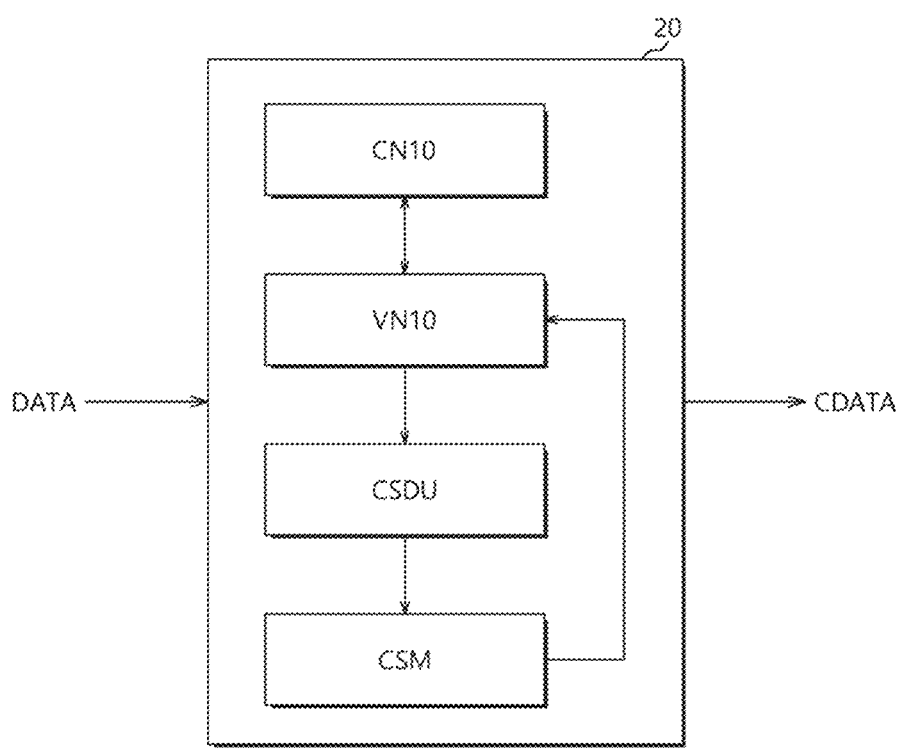
FIG. 4A is a block diagram illustrating a data processing device in accordance with an embodiment.
Figure 4B:
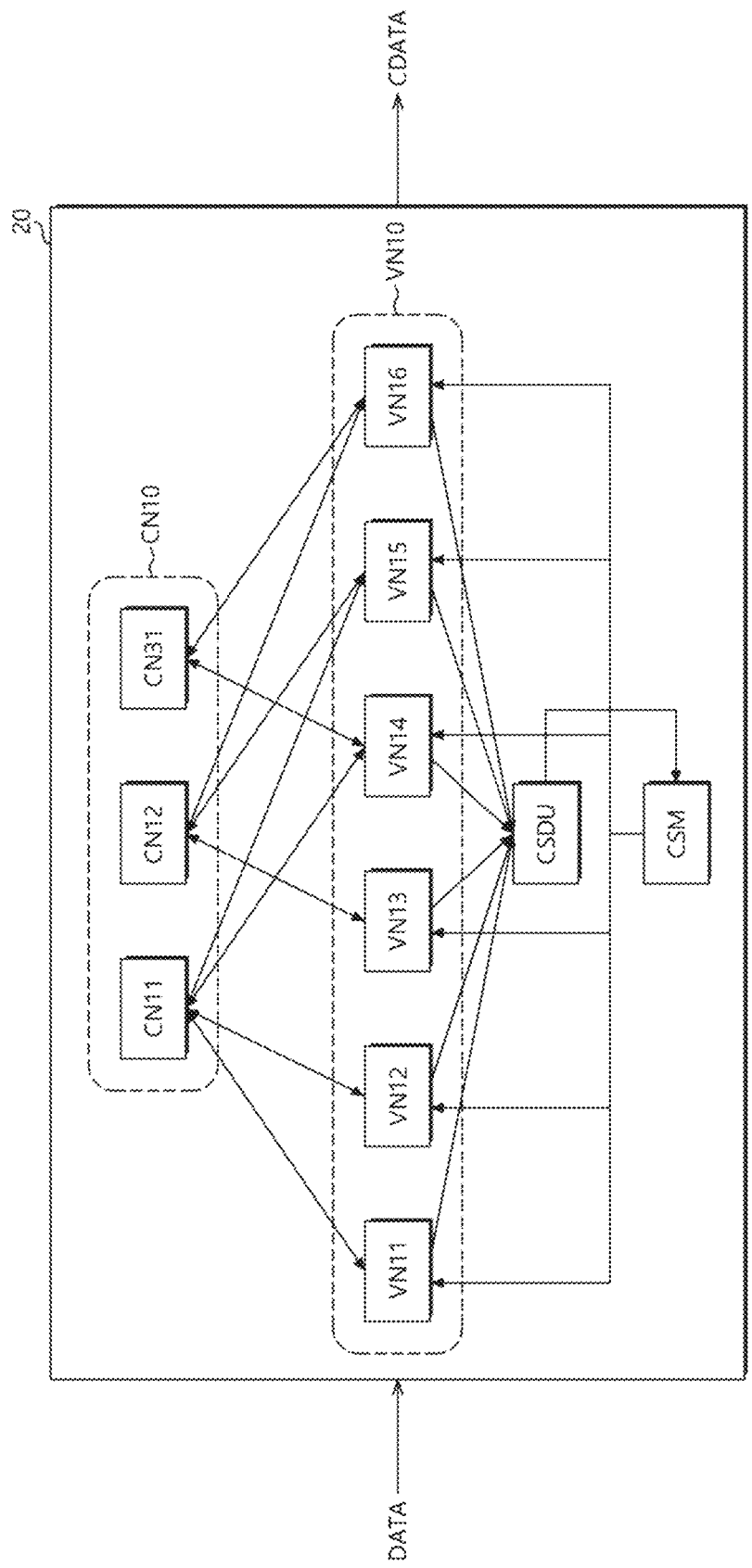
FIG. 4B is block diagram illustrating connections among elements of the data processing device of FIG. 4A.

FIG. 4A is a block diagram illustrating a data processing device 20 in accordance with an embodiment, and FIG. 4B is a block diagram illustrating connections among elements of the data processing device 20 of FIG. 4A.

Referring to FIG. 4A and FIG. 4B, the data processing device 20 may receive data DATA including a plurality of bits, perform an error correction operation on the data DATA, and output error-corrected data CDATA, similarly to the data processing device 10 of FIG. 1. In an embodiment, the data DATA may be a codeword sensed from a memory apparatus 120, which will be described later with reference to FIG. 9, and the codeword may include a plurality of codeword bits. The data processing device 20, for example, may be configured on the basis of an LDPC code algorithm or a bit flipping algorithm; however, the data processing device 20 may be configured on the basis of various error correction algorithms in accordance with an embodiment.

The data processing device 20 may include variable nodes VN10, check nodes CN10, a group state value manager CSDU, and a group state value memory CSM. For example, the variable nodes VN10 may include and refer to variable nodes VN11 to VN16. For example, the check nodes CN10 may include and refer to check nodes CN11 to CN31. In the embodiment of FIG. 4B, the number of variable nodes, the number of check nodes, and a connection relation between the variable nodes VN10 and the check nodes CN10 are shown as mere examples and the present disclosure is not limited thereto.

Each of the variable nodes VN10 (i.e., the variable nodes VN11 to VN16) may be electrically or logically connected to one or more corresponding check nodes selected from the check nodes CN on the basis of an error correction algorithm applied to the data processing device 20. Furthermore, each of the variable nodes VN10 may be electrically or logically connected to the group state value manager CSDU.

Each of the variable nodes VN10 may receive and store a corresponding bit included in the data DATA as its own target bit, and perform an error correction operation on the stored target bit.

For example, each of the variable nodes VN10 may transmit its own target bit to corresponding check nodes, and count unsatisfied check nodes of the corresponding check nodes. Furthermore, each of the variable nodes VN10 may flip its own target bit on the basis of a group state value transmitted from the group state value memory CSM and the value of a flipping function. A specific method in which each of the variable nodes VN10 flips the target bit will be described in detail with reference to FIG. 5.

Figure 5:
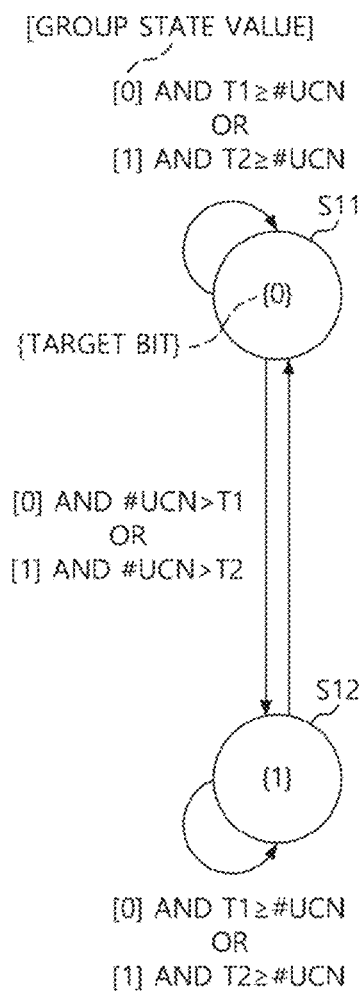
FIG. 5 is a diagram for explaining a method in which each variable node of FIG. 4A flips a target bit in accordance with an embodiment.

FIG. 5 is a diagram for explaining a method in which each of the variable nodes VN10 of FIG. 4A flips a target bit in accordance with an embodiment. Unlike the variable nodes VN of FIG. 1, each of the variable nodes VN10 of FIG. 4A may only flip the target bit by simply referring to the group state value without changing the group state value. The group state value may be a value updated in the previous iteration and stored in the group state value memory CSM. The group state value is to be updated by the group state value manager CSDU according to a flipping result of the target bits by the variable nodes VN10, as will be described below. FIG. 5 illustrates a case where the number of unsatisfied check nodes #UCN is used as the value of the flipping function.

Referring to FIG. 5, a first state S11 may indicate a state in which the target bit of each variable node is 0, and a second state S12 may indicate a state in which the target bit of each variable node is 1. Each of the variable nodes VN10 may be placed in any one of the first and second states S11 and S12 by flipping the target bit according to the group state value stored in the group state value memory CSM and the number of its own unsatisfied check nodes #UCN. FIG. 5 does not illustrate a process in which the target bit is flipped and then the group state value is updated.

For example, when the group state value is 0 and the number of unsatisfied check nodes #UCN exceeds the first threshold value T1 or when the group state value is 1 and the number of unsatisfied check nodes #UCN exceeds the second threshold value T2, each variable node may flip the target bit. This case may result in a transition between the first state S11 and the second state S12.

Furthermore, when the group state value is 0 and the number #UCN of unsatisfied check nodes is substantially equal to or less than the first threshold value T1 or when the group state value is 1 and the number #UCN of unsatisfied check nodes is substantially equal to or less than the second threshold value T2, each variable node may not flip the target bit. This case may result in the maintaining of the first state S11 or the maintaining of the second state S12.

In accordance with an embodiment, each of the variable nodes VN10 may flip its own target bit on the basis of the group state value transmitted from the group state value memory CSM and the value of the flipping function. The value of the flipping function may be different for each variable node VN10. A value E2 of the flipping function of a certain variable node may be determined on the basis of Equation 2 below.

$$E2 = a21*(r \oplus c) + a22*\#UCN + a23*\#SCN \quad \text{[Equation 2]}$$

In Equation 2 above, the constants a21, a22, and a23 may be different from one another for each variable node VN10. Furthermore, the constants a21, a22, and a23 may be changed according to the number of check nodes electrically or logically connected to a variable node and the number of iterations repeated up to now. The constants a21, a22, and a23 may be predetermined or selected from values set through experiments.

In Equation 2 above, the value r may indicate a target bit initially inputted to the variable node.

In Equation 2 above, the value c may be a value of the target bit of the variable node corrected according to the result of an immediately previous iteration.

In Equation 2 above, the operation ED may be an exclusive OR operation.

In Equation 2 above, #UCN may be the number of unsatisfied check nodes counted by the variable node in the current iteration.

In Equation 2 above, #SCN may be the number of check nodes, other than the unsatisfied check nodes among check nodes electrically or logically connected to the variable node, that is, satisfied check nodes, counted by the variable node in the current iteration.

A method of using the value E2 of the flipping function calculated according to Equation 2 above when each of the variable nodes VN10 flips the target bit may be the same as that of using the number #UCN of unsatisfied check nodes described in FIG. 5. The number #UCN of unsatisfied check nodes illustrated in FIG. 5 may be an embodiment of the value E2 of the flipping function. That is, when the constant a21 is 0 and the constant a22 is 1, each of the variable nodes VN10 may use the number #UCN of unsatisfied check nodes as the value E2 of the flipping function. Accordingly, a detailed description thereof will be omitted.

In accordance with an embodiment, the flipping function is not limited to Equation 2 above.

Referring back to FIG. 4A and FIG. 4B, each of the variable nodes VN10 may notify the group state value manager CSDU of whether each of the variable nodes VN10 has flipped its own target bit and the value of the flipping function has exceeded the second threshold value T2.

Each of the check nodes CN10 (i.e., the check nodes CN11 to CN13) may be electrically or logically connected to one or more variable nodes VN10 selected from the variable nodes VN10, that is, corresponding variable nodes on the basis of the error correction algorithm applied to the data processing device 20. Each of the check nodes CN10 may receive target bits from corresponding variable nodes, check whether the target bits have an error bit, and transmit the check result to the corresponding variable nodes. The check nodes CN10 may operate in the same manner as described with reference to FIG. 2.

The group state value manager CSDU may be electrically or logically connected to the variable nodes VN10. The variable nodes VN10 electrically or logically connected to the one group state value manager CSDU may constitute a variable node group. The variable node group may be composed of a plurality of variable nodes VN10 sharing a group state value. The variable node group, for example, may be composed of $2^m$ variable nodes VN10 (m is a natural number).

The group state value manager CSDU may receive, from the variable nodes VN10, information about whether the target bit has been flipped and whether the value of the flipping function has exceeded the second threshold value, and determine whether there is a variable node having flipped the target bit among the variable nodes VN10 and whether there is a variable node, in which the value of the flipping function has exceeded the second threshold value, among the variable nodes VN10.

Furthermore, when there is at least one variable node having flipped the target bit among the variable nodes VN10, the group state value manager CSDU may determine the group state value as 0. That is, when the current group state value is already 0, the group state value manager CSDU may maintain the group state value, and when the current group state value is 1, the group state value manager CSDU may change the group state value to 0.

Furthermore, when there is no variable node having flipped the target bit and there is at least one variable node in which the value of the flipping function has exceeded the second threshold value among the variable nodes VN10, the group state value manager CSDU may determine the group state value as 1. That is, when the current group state value is already 1, the group state value manager CSDU may maintain the group state value, and when the current group state value is 0, the group state value manager CSDU may change the group state value to 1.

Furthermore, when there is no variable node having flipped the target bit and there is no at least one variable node, in which the value of the flipping function has exceeded the second threshold value, among the variable nodes VN10, the group state value manager CSDU may maintain the group state value.

Meanwhile, the determination of the group state value manager CSDU regarding whether there is a variable node having flipped the target bit among the variable nodes VN10 may actually indicate the determination regarding whether there is a variable node, in which the value of the flipping function has exceeded the first threshold value, among the variable nodes VN10. Accordingly, in accordance with an embodiment, the group state value manager CSDU may receive, from the variable nodes VN10, information about whether the value of the flipping function has exceeded the first threshold value and whether the value of the flipping function has exceeded the second threshold value, and determine whether there is a variable node in which the value of the flipping function has exceeded the first threshold value among the variable nodes VN10 and whether there is a variable node, in which the value of the flipping function has exceeded the second threshold value, among the variable nodes VN10.

Furthermore, when there is at least one variable node in which the value of the flipping function has exceeded the first threshold value among the variable nodes VN10, the group state value manager CSDU may determine the group state value as 0. That is, when the current group state value is already 0, the group state value manager CSDU may maintain the group state value, and when the current group state value is 1, the group state value manager CSDU may change the group state value to 0.

Furthermore, when there is no variable node in which the value of the flipping function has exceeded the first threshold value and there is at least one variable node in which the value of the flipping function has exceeded the second threshold value among the variable nodes VN10, the group state value manager CSDU may determine the group state value as 1. In other words, when there is at least one variable node, in which the value of the flipping function is substantially equal to or less than the first threshold value and has exceeded the second threshold value, among the variable nodes VN10, the group state value manager CSDU may determine the group state value as 1. That is, when the current group state value is already 1, the group state value manager CSDU may maintain the group state value, and when the current group state value is 0, the group state value manager CSDU may change the group state value to 1.

Furthermore, when there is no at least one variable node, in which the value of the flipping function has exceeded the second threshold value, among the variable nodes VN10, the group state value manager CSDU may maintain the group state value.

Furthermore, the group state value memory CSM may be electrically connected to the group state value manager CSDU and the variable nodes VN10. The group state value memory CSM may store group state values to be in common referred to by the variable nodes VN10. The group state value may indicate whether the target bits of the variable nodes VN10 are reliable. In accordance with an embodiment, the group state value may be composed of 2 bits or more.

In accordance with an embodiment, when the target bits are inputted to the variable nodes VN10, initial group state values stored in the group state value memory CSM may be first values, that is, 0's.

The procedure, in which each of the variable nodes VN10 transmits the target bit to corresponding to check nodes and flips the target bit according to the check results of the corresponding check nodes and the group state value manager CSDU updates the group state values may constitute a single iteration of the error correction operation. After the single iteration is performed, the variable nodes VN10 may perform a subsequent iteration in the same manner. The variable nodes VN10 may repeat the iteration a predetermined number of times until the check nodes determine that the target bits have no error bit.

In accordance with an embodiment, the first threshold value and the second threshold value referred to by the variable nodes VN10 may be increased whenever the iteration is repeated.

In accordance with an embodiment, depending on the number of check nodes electrically or logically connected to the variable nodes VN10, the variable nodes VN10 may refer to first threshold values different from each other and second threshold values different from each other.

Figure 4C:
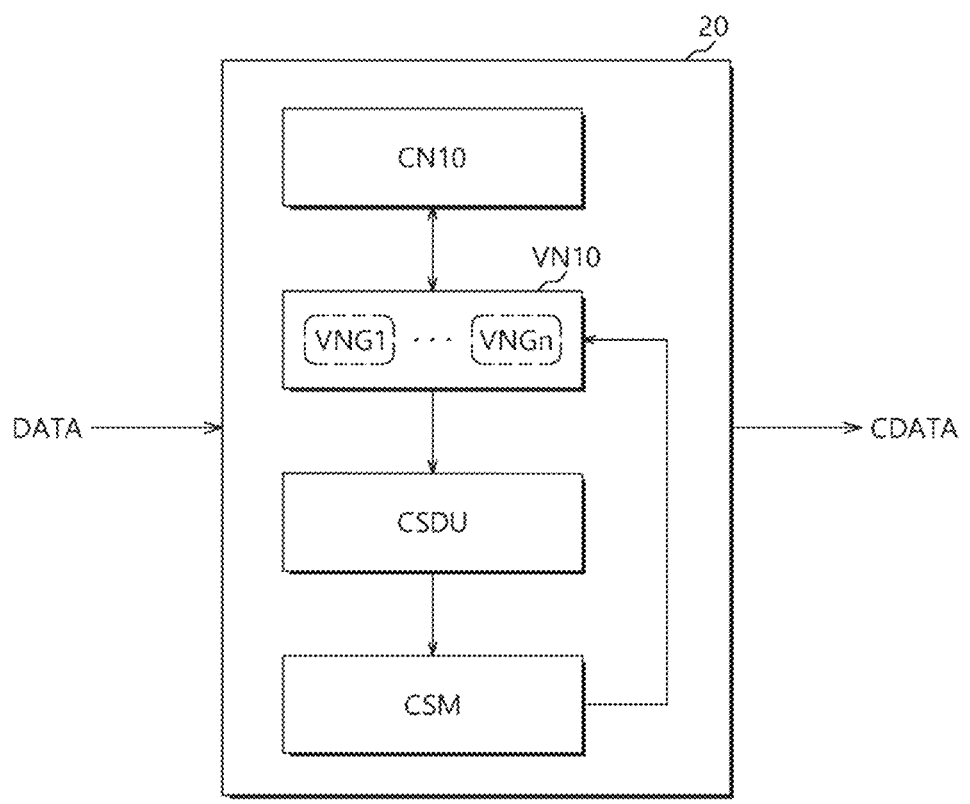
FIG. 4C is a diagram for illustrating an embodiment in which the variable nodes of FIG. 4A and FIG. 4B are grouped into a plurality of variable node groups.

FIG. 4C illustrates an embodiment in which the variable nodes VN10 such as that shown in FIG. 4A and FIG. 4B are grouped into a plurality of variable node groups VNG1 to VNGn. That is, each of the variable node groups VNG1 to VNGn may include the variable nodes VN11 to VN16 shown in FIGS. 4A and 4B.

Each of the variable node groups VNG1 to VNGn may have a corresponding group state value, compared to the case where the variable nodes VN10 of FIG. 4A and FIG. 4B are grouped into one variable node group to have one group state value. The group state value manager CSDU may determine a corresponding group state value for each of the variable node groups according to the aforementioned method. Hereinafter, an operation method of the data processing device 20 for one variable node group and one group state value will be described as an example in detail with reference to FIG. 4A and FIG. 4B.

Figure 6A:
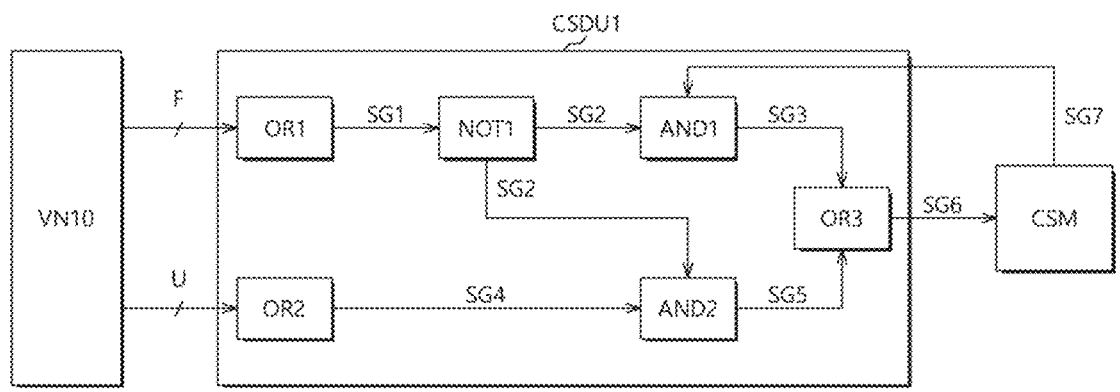
FIG. 6A and FIG. 6B are block diagrams illustrating a configuration of a group state value manager of FIG. 4A.
Figure 6B:
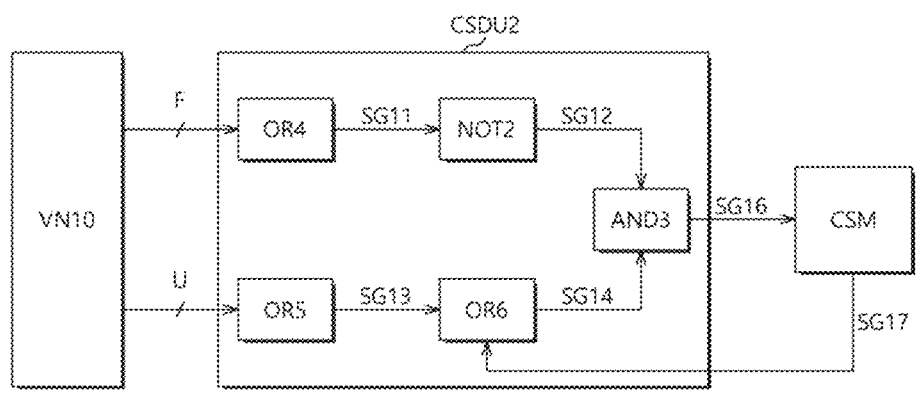

FIG. 6A and FIG. 6B are block diagrams illustrating a configuration of the group state value manager CSDU of FIG. 4A.

A group state value manager CSDU1 shown in FIG. 6A may be an embodiment of the group state value manager CSDU of FIG. 4A. The group state value manager CSDU1 may receive signals F and signals U from the variable nodes VN10.

Each of the variable nodes VN10 may transmit the signal F indicating whether the target bit has been flipped to the group state value manager CSDU1. For example, when the target bit has been flipped, each of the variable nodes VN10 may transmit the signal F having a value of 1, and when the target bit has not been flipped, each of the variable nodes VN10 may transmit the signal F having a value of 0.

Each of the variable nodes VN10 may transmit the signal U indicating whether the value of the flipping function has exceeded the second threshold value T2 to the group state value manager CSDU1. For example, when the value of the flipping function has exceeded the second threshold value T2, each of the variable nodes VN10 may transmit the signal U having a value of 1, and when the value of the flipping function has not exceeded the second threshold value T2, each of the variable nodes VN10 may transmit the signal U having a value of 0.

The group state value manager CSDU1 may determine a group state value SG6 on the basis of the signals F and the signals U transmitted from the variable nodes VN10, and transmit the group state value SG6 to the group state value memory CSM.

In an embodiment, the group state value manager CSDU1 may include first to third OR units OR1 to OR3, an inversion unit NOT1, and first and second AND units AND1 and AND2.

The first OR unit OR1 may receive the signals F from the variable nodes VN10, and output a signal SG1 obtained by performing an OR operation. That is, when there is at least one variable node among the variable nodes VN10 having flipped the target bit, the first OR unit OR1 may output the signal SG1 having a value of 1. When there is no variable node having flipped the target bit among the variable nodes VN10, the first OR unit OR1 may output the signal SG1 having a value of 0.

The inversion unit NOT1 may receive the signal SG1 from the first OR unit OR1, and output a signal SG2 obtained by inverting the signal SG1.

The first AND unit AND1 may receive the signal SG2 from the inversion unit NOT1, receive a currently stored group state value SG7 from the group state value memory CSM, and output a signal SG3 obtained by performing an AND operation.

The second OR unit OR2 may receive the signals U from the variable nodes VN10, and output a signal SG4 obtained by performing an OR operation. That is, when there is at least one variable node, in which the value of the flipping function has exceeded the second threshold value T2, among the variable nodes VN10, the second OR unit OR2 may output the signal SG4 having a value of 1. When there is no variable node, in which the value of the flipping function has exceeded the second threshold value T2, among the variable nodes VN10, the second OR unit OR2 may output the signal SG4 having a value of 0.

The second AND unit AND2 may receive the signal SG2 from the inversion unit NOT1, receive the signal SG4 from the second OR unit OR2, and output a signal SG5 obtained by performing an AND operation.

The third OR unit OR3 may receive the signals SG3 from the first AND unit AND1, receive the signals SG5 from the second AND unit AND2, and output the group state value SG6 obtained by performing an OR operation. The group state value SG6 may be inputted to the group state value memory CSM.

In accordance with an embodiment, each of the variable nodes VN10 may transmit the signal F indicating whether the value of the flipping function has exceeded the first threshold value T1, to the group state value manager CSDU1. The reason for this, as described above, is because the flipping of the target bit indicates that the value of the flipping function exceeds the first threshold value T1. Accordingly, when the value of the flipping function has exceeded the first threshold value T1, each of the variable nodes VN10 may transmit the signal F having a value of 1, and when the value of the flipping function has not exceeded the first threshold value T1, each of the variable nodes VN10 may transmit the signal F having a value of 0. In such a case, a method in which the group state value manager CSDU1 operates on the basis of the signals F is the same as described above.

A group state value manager CSDU2 shown in FIG. 6B may be an embodiment of the group state value manager CSDU of FIG. 4A. The group state value manager CSDU2 may receive signals F and signals U from the variable nodes VN10.

Similar to the description of FIG. 6A, each of the variable nodes VN10 may transmit the signal F indicating whether the target bit has been flipped to the group state value manager CSDU2. In accordance with an embodiment, each of the variable nodes VN10 may transmit the signal F indicating whether the value of the flipping function has exceeded the first threshold value T1 to the group state value manager CSDU2.

Furthermore, each of the variable nodes VN10 may transmit the signal U indicating whether the value of the flipping function has exceeded the second threshold value T2 to the group state value manager CSDU2.

The group state value manager CSDU2 may determine a group state value SG16 on the basis of the signals F and the signals U transmitted from the variable nodes VN10, and transmit the group state value SG16 to the group state value memory CSM.

According to an embodiment, the group state value manager CSDU2 may include fourth to sixth OR units OR4 to OR6, an inversion unit NOT2, and an AND unit AND3.

The fourth OR unit OR4 may receive the signals F from the variable nodes VN10, and output a signal SG11 obtained by performing an OR operation. The operation method of the fourth OR unit OR4 may be substantially similar to that of the first OR unit OR1 of FIG. 6A.

The inversion unit NOT2 may receive the signal SG11 from the fourth OR unit OR4, and output a signal SG12 obtained by inverting the signal SG11.

The fifth OR unit OR5 may receive the signals U from the variable nodes VN10, and output a signal SG13 obtained by performing an OR operation. The operation method of the fifth OR unit OR5 may be substantially similar to that of the second OR unit OR2 of FIG. 6A.

The sixth OR unit OR6 may receive the signal SG13 from the fifth OR unit OR5, receive a currently stored group state value SG17 from the group state value memory CSM, and output a signal SG14 obtained by performing an OR operation.

The AND unit AND3 may receive the signal SG12 from the inversion unit NOT2, receive the signal SG14 from the sixth OR unit OR6, and output the group state value SG16 obtained by performing an AND operation. The group state value SG16 may be inputted to the group state value memory CSM.

Figure 7:
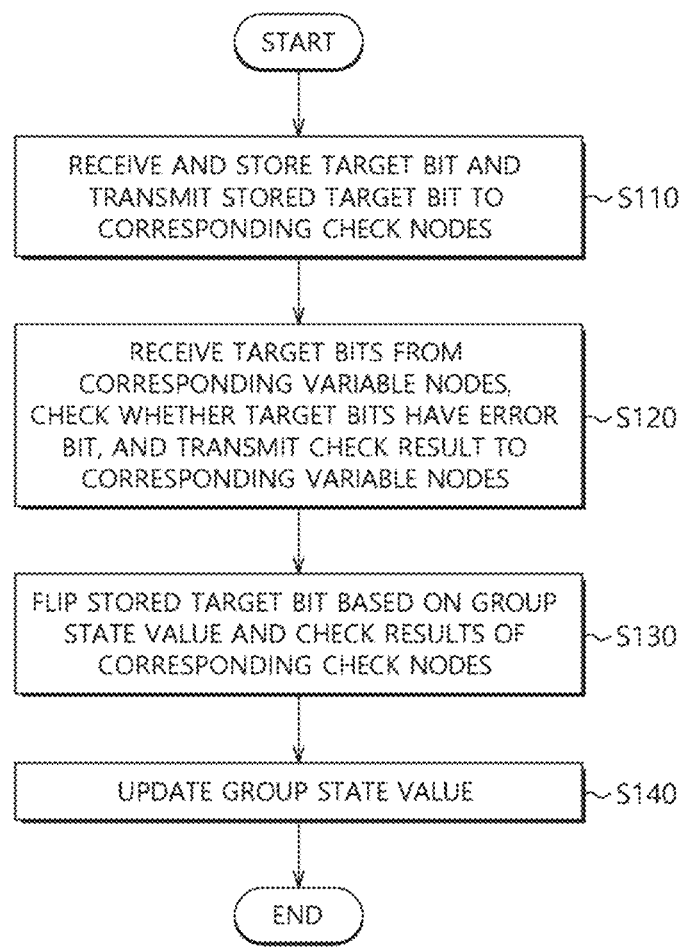
FIG. 7 is a flowchart illustrating a method in which each variable node of FIG. 4A performs an iteration with corresponding check nodes in accordance with an embodiment.

FIG. 7 is a flowchart illustrating a method in which each of the variable nodes VN10 of FIG. 4A performs an iteration with corresponding check nodes in accordance with an embodiment.

Referring to FIG. 7, in step S110, each variable node may receive and store a corresponding target bit within the data DATA, and transmit the stored target bit to one or more corresponding check nodes.

In step S120, each check node may receive one or more target bits from one or more corresponding variable nodes, check whether the received target bits have an error bit, and transmit the check result to the corresponding variable nodes. For example, each check node may check whether the received target bits have an error bit by checking whether the value sum of the target bits transmitted from the corresponding variable nodes is 0.

In step S130, each variable node may flip the stored target bit on the basis of the group state value and the check results of the corresponding check nodes. For example, each variable node may count unsatisfied check nodes among the corresponding check nodes on the basis of the check results of the corresponding check nodes, and flip the stored target bit on the basis of the group state value and the value of the flipping function.

In step S140, the group state value manager CSDU may update the group state value.

Figure 8A:
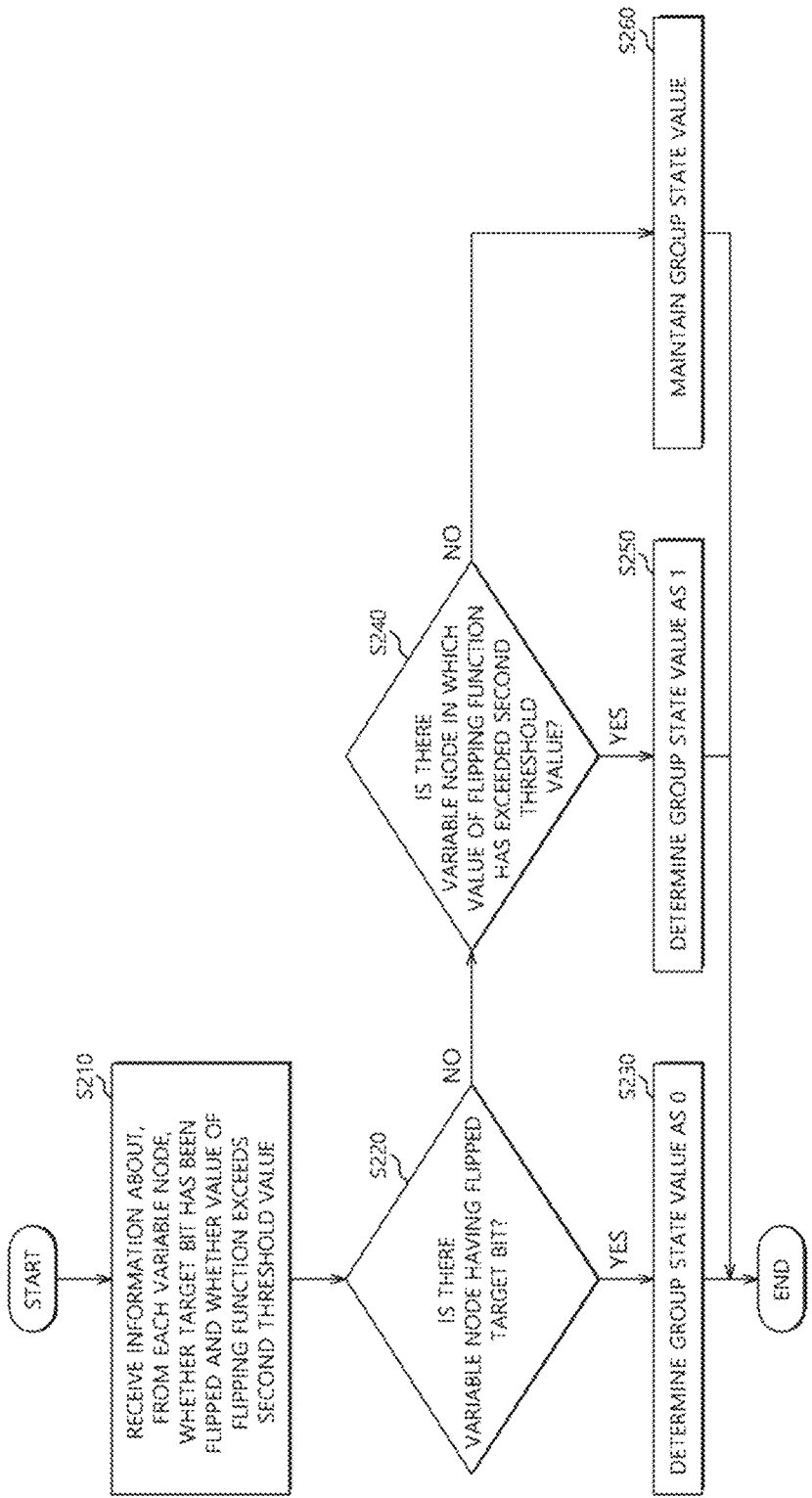

FIG. 8A and FIG. 8B are flowcharts illustrating a method in which the group state value manager CSDU of FIG. 4A updates the group state value in accordance with an embodiment. The procedures illustrated in FIG. 8A and FIG. 8B may be detailed embodiments of step S140 in FIG. 7.

Referring to FIG. 8A, in step S210, the group state value manager CSDU may receive, from each of the variable nodes VN10, information about whether the target bit has been flipped and whether the value of the flipping function exceeds the second threshold value.

In step S220, the group state value manager CSDU may determine whether there is a variable node having flipped the target bit among the variable nodes VN10. When there is the variable node having flipped the target bit (that is, "YES" at step S220), the procedure may proceed to step S230. However, when there is no variable node having flipped the target bit (that is, "NO" at step S220), the procedure may proceed to step S240.

In step S230, the group state value manager CSDU may determine the group state value as 0. That is, when the current group state value is already 0, the group state value manager CSDU may maintain the group state value, and when the current group state value is 1, the group state value manager CSDU may change the group state value to 0.

In step S240, the group state value manager CSDU may determine whether there is a variable node, in which the value of the flipping function has exceeded the second threshold value, among the variable nodes VN10. When there is the variable node in which the value of the flipping function has exceeded the second threshold value (that is, "YES" at step S240), the procedure may proceed to step S250. However, when there is no variable node in which the value of the flipping function has exceeded the second threshold value (that is, "NO" at step S240), the procedure may proceed to step S260.

In step S250, the group state value manager CSDU may determine the group state value as 1. That is, when the current group state value is already 1, the group state value manager CSDU may maintain the group state value, and when the current group state value is 0, the group state value manager CSDU may change the group state value to 1.

In step S260, the group state value manager CSDU may maintain the group state value.

Referring to FIG. 8B, in step S310, the group state value manager CSDU may receive information about, from each of the variable nodes VN10, whether the value of the flipping function exceeds the first threshold value and whether the value of the flipping function exceeds the second threshold value.

In step S320, the group state value manager CSDU may determine whether there is a variable node, in which the value of the flipping function has exceeded the first threshold value, among the variable nodes VN10. When there is the variable node in which the value of the flipping function has exceeded the first threshold value (that is, "YES" at step S320), the procedure may proceed to step S330. However, when there is no variable node in which the value of the flipping function has exceeded the first threshold value (that is, "NO" at step S320), the procedure may proceed to step S340.

In step S330, the group state value manager CSDU may determine the group state value as 0. That is, when the current group state value is already 0, the group state value manager CSDU may maintain the group state value, and when the current group state value is 1, the group state value manager CSDU may change the group state value to 0.

In step S340, the group state value manager CSDU may determine whether there is a variable node, in which the value of the flipping function has exceeded the second threshold value, among the variable nodes VN10. When there is the variable node in which the value of the flipping function has exceeded the second threshold value (that is, "YES" at step S340), the procedure may proceed to step S350. However, when there is no variable node in which the value of the flipping function has exceeded the second threshold value (that is, "NO" at step S340), the procedure may proceed to step S360.

In step S350, the group state value manager CSDU may determine the group state value as 1. That is, when the current group state value is already 1, the group state value manager CSDU may maintain the group state value, and when the current group state value is 0, the group state value manager CSDU may change the group state value to 1.

In step S360, the group state value manager CSDU may maintain the group state value.

Figure 9:
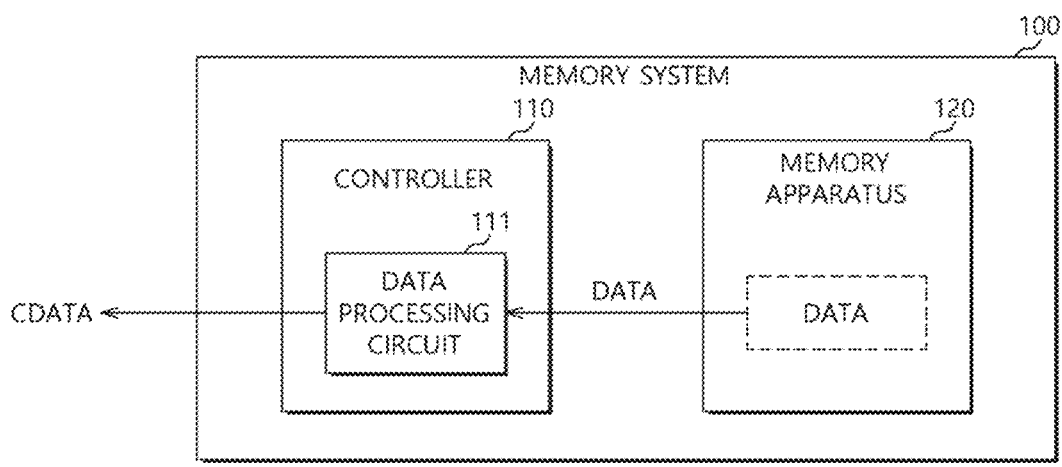
FIG. 9 is a block diagram illustrating a memory system in accordance with an embodiment.

FIG. 9 is a block diagram illustrating a memory system 100 in accordance with an embodiment.

Referring to FIG. 9, the memory system 100 may be configured to store data provided from an external host device in response to a write request of the host device. Furthermore, the memory system 100 may be configured to provide the host device with the stored data in response to a read request of the host device.

The memory system 100 may be composed of a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The memory system 100 may include a controller 110 and a memory apparatus 120.

The controller 110 may control all operations of the memory system 100. The controller 110 may access the memory apparatus 120 in order to process the requests of the host device. Furthermore, the controller 110 may access the memory apparatus 120 in order to perform an internal management operation or a background operation of the memory system 100, regardless of the requests of the host device. The access to the memory apparatus 120 may include write access and read access.

The controller 110 may include a data processing circuit 111. The data processing circuit 111 may perform an error correction operation on data DATA read from the memory apparatus 120, and output error-corrected data CDATA. The data processing circuit 111 may be configured and may operate in a similar manner to the data processing device 10 of FIG. 1 or the data processing device 20 of FIG. 4A.

The memory apparatus 120 may store the data DATA transmitted from the controller 110, read the stored data DATA, and transmit the read data DATA to the controller 110, under the control of the controller 110.

The memory apparatus 120 may include a nonvolatile memory apparatus and a volatile memory apparatus. The nonvolatile memory apparatus may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like. The volatile memory apparatus may include a Static Random Access Memory (SRAM), a Dynamic Random Access Memory (DRAM), and the like.

Figure 10:
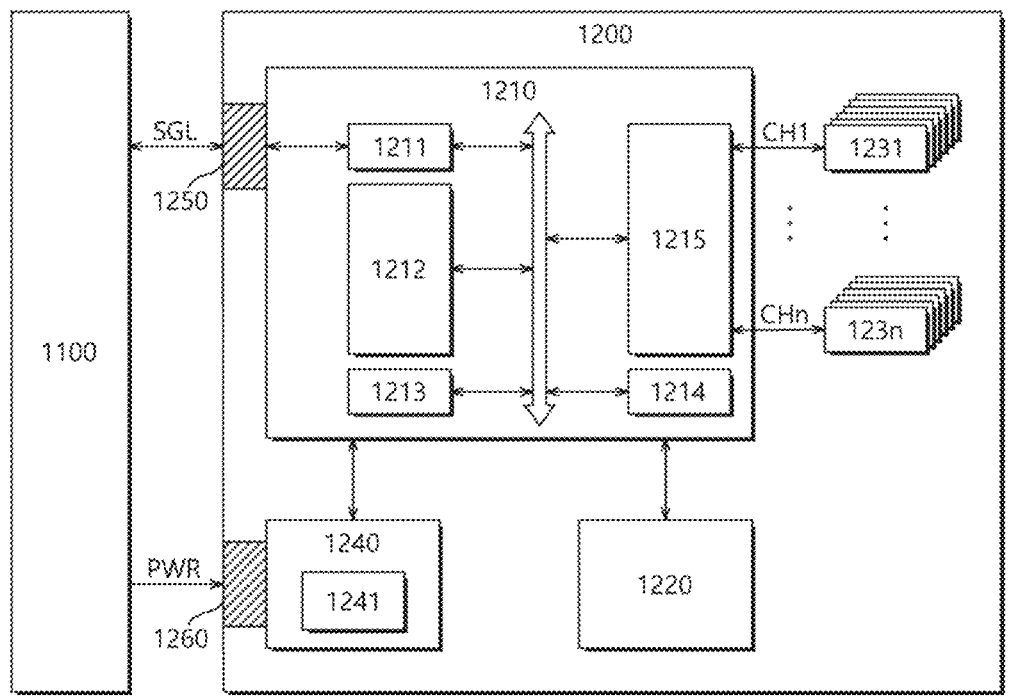
FIG. 10 is a diagram illustrating a data processing system including a solid state drive in accordance with an embodiment.

FIG. 10 is a diagram illustrating a data processing system including a solid state drive (SSD) in accordance with an embodiment. Referring to FIG. 10, a data processing system 1000 may include a host device 1100 and a solid state drive (Hereinafter, referred to as SSD) 1200.

The SSD 1200 may include a controller 1210, a buffer memory apparatus 1220, nonvolatile memory apparatuses 1231 to 123n, a power supply 1240, a signal connector 1250, and a power connector 1260.

The controller 1210 may control all operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data and the like. The host interface unit 1211 may serve as an interface between the host device 1100 and the SSD 1200 according to the protocol of the host device 1100. For example, the host interface unit 1211 may communicate with the host device 1100 through any one of standard interface protocols such as a secure digital, a Universal Serial Bus (USB), a Multi-Media Card (MMC), an embedded MMC (eMMC), a Personal Computer Memory Card International Association (PCMCIA), a Parallel Advanced Technology Attachment (PATA), a Serial Advanced Technology Attachment (SATA), a Small Computer System Interface (SCSI), a Serial Attached SCSI (SAS), a Peripheral Component Interconnection (PCI), a PCI Express (PCI-E), and a Universal Flash Storage (UFS).

The control unit 1212 may analyze and process the signal SGL inputted from the host device 1100. The control unit 1212 may control the operations of background function blocks according to firmware or software for driving the SSD 1200. The random access memory 1213 may be used as a working memory for driving such firmware or software.

The error correction code (ECC) unit 1214 may generate parity data of data to be transmitted to the nonvolatile memory apparatuses 1231 to 123n. The generated parity data may be stored in the nonvolatile memory apparatuses 1231 to 123n together with the data. On the basis of the parity data, the error correction code (ECC) unit 1214 may detect an error of the data read from the nonvolatile memory apparatuses 1231 to 123n. When the detected error is within a correctable range, the error correction code (ECC) unit 1214 may correct the detected error.

The error correction code (ECC) unit 1214 may be configured and may operate similarly to the data processing device 10 of FIG. 1 or the data processing device 20 of FIG. 4A.

The memory interface unit 1215 may provide a control signal such as a command and an address to the nonvolatile memory apparatuses 1231 to 123n under the control of the control unit 1212. Furthermore, the memory interface unit 1215 may exchange data with the nonvolatile memory apparatuses 1231 to 123n under the control of the control unit 1212. For example, the memory interface unit 1215 may provide the nonvolatile memory apparatuses 1231 to 123n with data stored in the buffer memory apparatus 1220 or provide the buffer memory apparatus 1220 with data read from the nonvolatile memory apparatuses 1231 to 123n.

The buffer memory apparatus 1220 may temporarily store data to be stored in the nonvolatile memory apparatuses 1231 to 123n. Furthermore, the buffer memory apparatus 1220 may temporarily store the data read from the nonvolatile memory apparatuses 1231 to 123n. The data temporarily stored in the buffer memory apparatus 1220 may be transmitted to the host device 1100 or the nonvolatile memory apparatuses 1231 to 123n under the control of the controller 1210.

The nonvolatile memory apparatuses 1231 to 123n may be used as a storage medium of the SSD 1200. The nonvolatile memory apparatuses 1231 to 123n may be electrically or logically connected to the controller 1210 through a plurality of channels CH1 to CHn. One or more nonvolatile memory apparatuses may be electrically or logically connected to one channel. The nonvolatile memory apparatuses electrically or logically connected to one channel may be electrically or logically connected to substantially the same signal bus and data bus.

The power supply 1240 may provide power PWR inputted through the power connector 1260 to the background of the SSD 1200. The power supply 1240 may include an auxiliary power supply 1241. The auxiliary power supply 1241 may supply power such that the SSD 1200 is normally terminated when sudden power off occurs. The auxiliary power supply 1241 may include high-capacity capacitors.

The signal connector 1250 may be composed of various types of connectors according to an interface method between the host device 1100 and the SSD 1200.

The power connector 1260 may be composed of various types of connectors according to a power supply method of the host device 1100.

Figure 11:
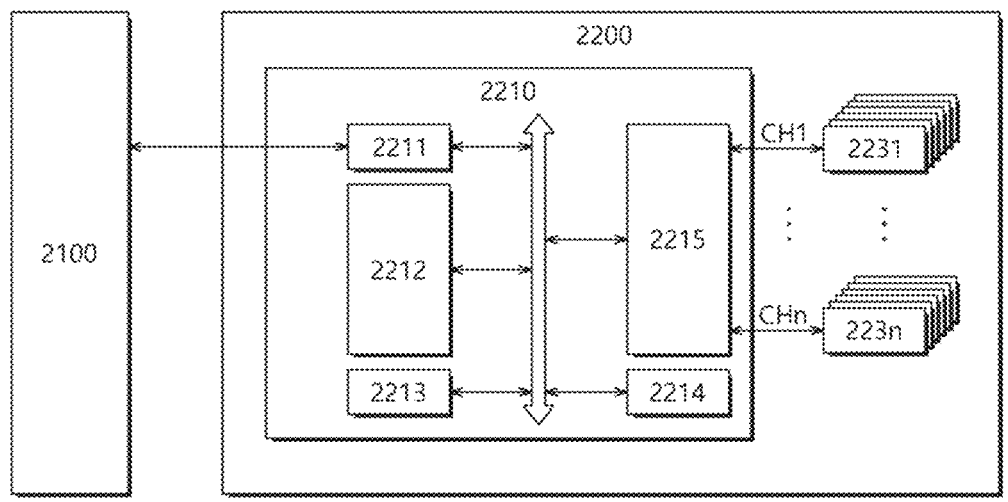
FIG. 11 is a diagram illustrating a data processing system including a mobile memory system in accordance with an embodiment.

FIG. 11 is a diagram illustrating a data processing system including a mobile memory system in accordance with an embodiment. Referring to FIG. 11, a data processing system 2000 may include a host device 2100 and a mobile memory system 2200.

The mobile memory system 2200 may be composed of Multimedia Cards (MMC, eMMC, RS-MMC, MMC-micro), a Universal Flash Storage (UFS), and the like. The mobile memory system 2200 may include a controller 2210 and nonvolatile memory apparatuses 2231 to 223n. The configuration and operation method of the controller 2210 may be similar to those of the controller 1210 of FIG. 9.

Figure 12:
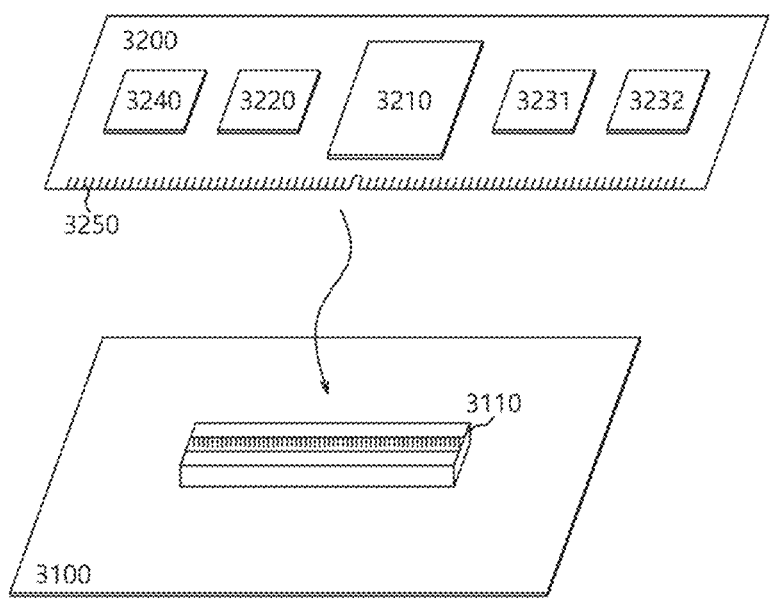
FIG. 12 is a diagram illustrating a data processing system including a memory system in accordance with an embodiment.

FIG. 12 is a diagram illustrating a data processing system including a memory system in accordance with an embodiment. Referring to FIG. 12, a data processing system 3000 may include a host device 3100 and a memory system 3200.

The host device 3100 may be configured in the form of a board such as a printed circuit board. Although not illustrated in the drawing, the host device 3100 may include background function blocks for performing the functions of the host device.

The host device 3100 may include an access terminal 3110 such as a socket, a slot, and a connector. The memory system 3200 may be mounted to the access terminal 3110.

The memory system 3200 may be configured in the form of a board such as a printed circuit board. The memory system 3200 may be called a memory module or a memory card. The memory system 3200 may include a controller 3210, a buffer memory apparatus 3220, nonvolatile memory apparatuses 3231 and 3232, a Power Management Integrated Circuit (PMIC) 3240, and an access terminal 3250.

The controller 3210 may control all operations of the memory system 3200. The controller 3210 may be configured in the same manner as the controller 1210 illustrated in FIG. 10 or the controller 2210 illustrated in FIG. 11.

The buffer memory apparatus 3220 may temporarily store data to be stored in the nonvolatile memory apparatuses 3231 and 3232. Furthermore, the buffer memory apparatus 3220 may temporarily store the data read from the nonvolatile memory apparatuses 3231 and 3232. The data temporarily stored in the buffer memory apparatus 3220 may be transmitted to the host device 3100 or the nonvolatile memory apparatuses 3231 and 3232 under the control of the controller 3210.

The nonvolatile memory apparatuses 3231 and 3232 may be used as a storage medium of the memory system 3200.

The PMIC 3240 may provide power inputted through the access terminal 3250 to the background of the memory system 3200. The PMIC 3240 may manage the power of the memory system 3200 under the control of the controller 3210.

The access terminal 3250 may be electrically or logically connected to the access terminal 3110 of the host device. A signal such as a command, an address, and data and power may be transferred between the host device 3100 and the memory system 3200 through the access terminal 3250. The access terminal 3250 may be configured in various forms according to an interface method between the host device 3100 and the memory system 3200. The access terminal 3250 may be disposed on one side of the memory system 3200.

Figure 13:
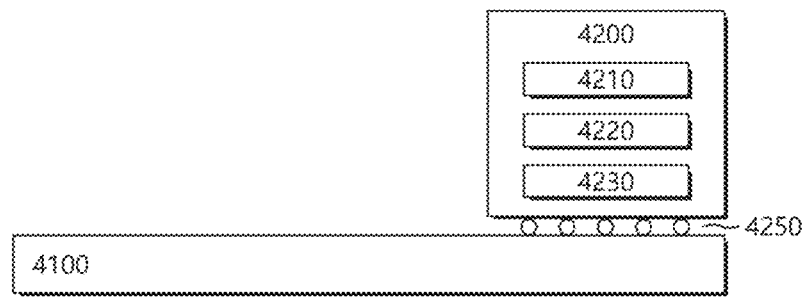
FIG. 13 is a diagram illustrating a data processing system including a memory system in accordance with an embodiment.

FIG. 13 is a diagram illustrating a data processing system including a memory system in accordance with an embodiment. Referring to FIG. 13, a data processing system 4000 may include a host device 4100 and a memory system 4200.

The host device 4100 may be configured in the form of a board such as a printed circuit board. Although not illustrated in the drawing, the host device 4100 may include background function blocks for performing the functions of the host device.

The memory system 4200 may be configured in a surface mount package form. The memory system 4200 may be mounted to the host device 4100 through solder balls 4250. The memory system 4200 may include a controller 4210, a buffer memory apparatus 4220, and a nonvolatile memory apparatus 4230.

The controller 4210 may control all operations of the memory system 4200. The controller 4210 may be configured in the same manner as the controller 1210 illustrated in FIG. 10 or the controller 2210 illustrated in FIG. 11.

The buffer memory apparatus 4220 may temporarily store data to be stored in the nonvolatile memory apparatus 4230. Furthermore, the buffer memory apparatus 4220 may temporarily store the data read from the nonvolatile memory apparatus 4230. The data temporarily stored in the buffer memory apparatus 4220 may be transmitted to the host device 4100 or the nonvolatile memory apparatus 4230 under the control of the controller 4210.

The nonvolatile memory apparatus 4230 may be used as a storage medium of the memory system 4200.

Figure 14:
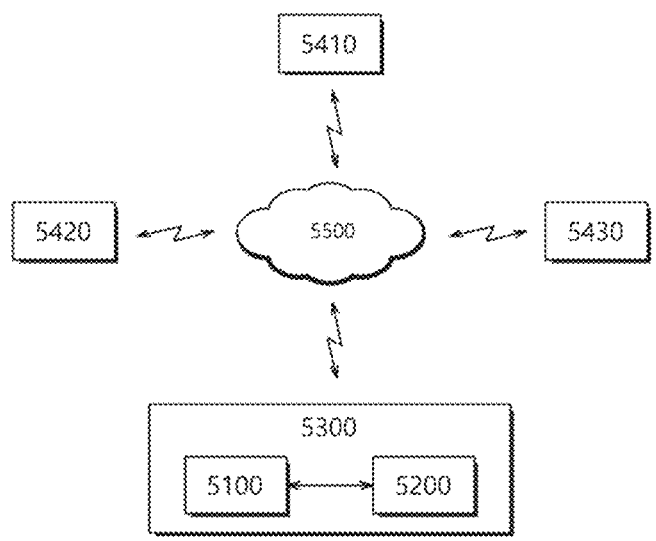
FIG. 14 is a diagram illustrating a network system including a memory system in accordance with an embodiment.

FIG. 14 is a diagram illustrating a network system including a memory system in accordance with an embodiment. Referring to FIG. 14, a network system 5000 may include a server system 5300 and a plurality of client systems 5410, 5420, and 5430, which are electrically connected to one another, through a network 5500.

The server system 5300 may service data in response to requests of the plurality of client systems 5410, 5420, and 5430. For example, the server system 5300 may store data provided from the plurality of client systems 5410, 5420, and 5430. In another example, the server system 5300 may provide data to the plurality of client systems 5410, 5420, and 5430.

The server system 5300 may include a host device 5100 and a memory system 5200. The memory system 5200 may be configured with the memory system 100 of FIG. 9, the SSD 1200 of FIG. 10, the mobile memory system 2200 of FIG. 11, the memory system 3200 of FIG. 12, and the memory system 4200 of FIG. 13.

Figure 15:
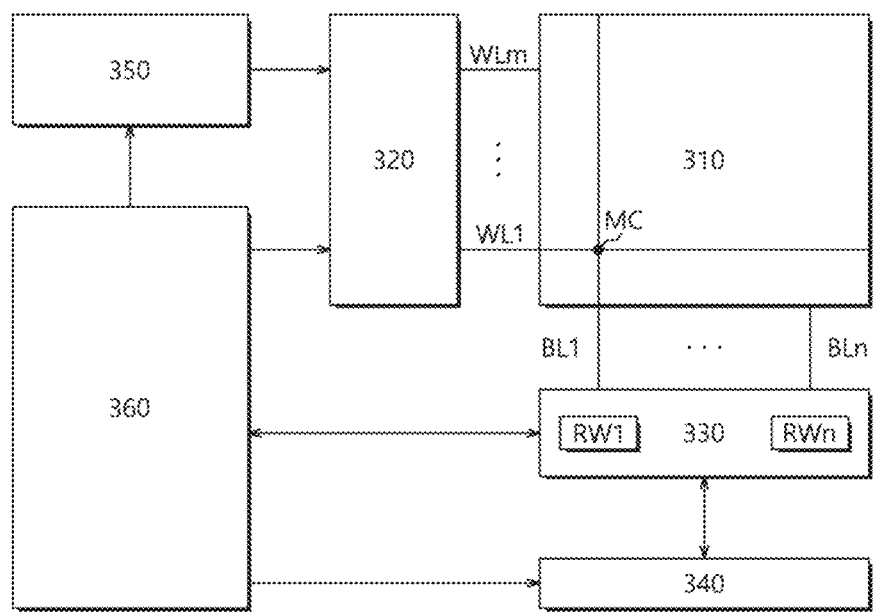
FIG. 15 is a block diagram illustrating a nonvolatile memory apparatus included in a memory system in accordance with an embodiment.

FIG. 15 is a block diagram illustrating a nonvolatile memory apparatus included in a memory system in accordance with an embodiment. Referring to FIG. 15, a nonvolatile memory apparatus 300 may include a memory cell array 310, a row decoder 320, a data read/write block 330, a column decoder 340, a voltage generator 350, and a control logic 360.

The memory cell array 310 may include memory cells MC arranged in intersection areas of word lines WL1 to WLm and bit lines BL1 to BLn.

The row decoder 320 may be electrically connected to the memory cell array 310 through the word lines WL1 to WLm. The row decoder 320 may operate under the control of the control logic 360. The row decoder 320 may decode an address provided from an external device (not illustrated). The row decoder 320 may select and drive the word lines WL1 to WLm on the basis of the decoding result. For example, the row decoder 320 may provide the word lines WL1 to WLm with a word line voltage provided from the voltage generator 350.

The data read/write block 330 may be electrically connected to the memory cell array 310 through the bit lines BL1 to BLn. The data read/write block 330 may include read/write circuits RW1 to RWn corresponding to the bit lines BL1 to BLn, respectively. The data read/write block 330 may operate under the control of the control logic 360. The data read/write block 330 may operate as a write driver or a sense amplifier according to an operation mode. For example, the data read/write block 330 may operate as a write driver that stores data provided from an external device in the memory cell array 310 during a write operation. In another example, the data read/write block 330 may operate as a sense amplifier that reads data from the memory cell array 310 during a read operation.

The column decoder 340 may operate under the control of the control logic 360. The column decoder 340 may decode an address provided from an external device. The column decoder 340 may electrically connect the read/write circuits RW1 to RWn of the data read/write block 330, which correspond to the bit lines BL1 to BLn, respectively, to data input/output lines (or data input/output buffers), on the basis of the decoding result.

The voltage generator 350 may generate voltages to be used in the background operations of the nonvolatile memory apparatus 300. The voltages generated by the voltage generator 350 may be applied to the memory cells of the memory cell array 310. For example, a program voltage generated during a program operation may be applied to word lines of memory cells to be subjected to the program operation. In another example, an erase voltage generated during an erase operation may be applied to well regions of memory cells to be subjected to the erase operation. In another example, a read voltage generated during a read operation may be applied to word lines of memory cells to be subjected to the read operation.

The control logic 360 may control all operations of the nonvolatile memory apparatus 300 on the basis of a control signal provided from an external device. For example, the control logic 360 may control the read, write, and erase operations of the nonvolatile memory apparatus 300.

While various embodiments have been described above, it will be understood to those skilled in the art that the embodiments described are examples only. Accordingly, the data processing device described herein should not be limited on the basis of the described embodiments.

What is claimed is:

1. A data processing device comprising:
   a plurality of variable nodes configured to receive and store a plurality of target bits;
   a plurality of check nodes each configured to receive stored target bits from one or more corresponding variable nodes of the plurality of variable nodes, check whether received target bits have an error bit, and transmit a check result to the corresponding variable nodes; and
   a group state value manager configured to determine group state values of variable node groups into which the plurality of variable nodes are grouped,
   wherein the plurality of variable nodes, the plurality of check nodes, and the group state value manager perform an error correction operation for the plurality of target bits by repeating iterations, each iteration including selective flipping of the plurality of target bits and updating of the group state values based on the flipping,
   wherein first variable nodes included in a first variable node group among the variable node groups commonly refer to a first group state value among the group state values,
   wherein, in a current iteration, each of the first variable nodes selectively flips a stored target bit on the basis of (a) the first group state value updated on the basis of flipping of the first variable nodes in a previous iteration and (b) a number of unsatisfied check nodes determined in the current iteration, and
   wherein, in the current iteration, the group state value manager updates the first group state value as an initial value of the first group state value when at least one of the first variable nodes flips the stored target bit.

2. The data processing device according to claim 1, wherein, in the current iteration, each of the first variable nodes counts the number of unsatisfied check nodes on the basis of check results of corresponding check nodes, determines a value of a flipping function on the basis of the number of unsatisfied check nodes, and flips the stored target bit on the basis of the first group state value and the value of the flipping function.

3. The data processing device according to claim 2, wherein, in the current iteration, when the first group state value is a first value and the value of the flipping function exceeds a first threshold value or when the first group state value is a second value and the value of the flipping function exceeds a second threshold value, which is smaller than the first threshold value, each of the first variable nodes flips the stored target bit.

4. The data processing device according to claim 2, wherein, in the current iteration, when the first group state value is a first value and the value of the flipping function is substantially equal to or less than a first threshold value or when the first group state value is a second value and the value of the flipping function is substantially equal to or less than a second threshold value, which is smaller than the first threshold value, each of the first variable nodes does not flip the stored target bit.

5. The data processing device according to claim 2, wherein, in the current iteration, the unsatisfied check node is a check node having transmitted the check result indicating that the received target bits have the error bit among the corresponding check nodes.

6. The data processing device according to claim 2, wherein, in the current iteration, when there is no first variable node having flipped the stored target bit and there is a first variable node, in which the value of the flipping function has exceeded a second threshold value, the group state value manager updates the first group state value as a second value.

7. The data processing device according to claim 2, wherein, in the current iteration, when there is no first variable node having flipped the stored target bit and there is no first variable node, in which the value of the flipping function has exceeded a second threshold value, the group state value manager maintains the first group state value.

8. The data processing device according to claim 2, wherein, in the current iteration, when there is a first variable node, in which the value of the flipping function has exceeded a first threshold value, the group state value manager updates the first group state value as the initial value.

9. The data processing device according to claim 2, wherein, in the current iteration, when there is no first variable node, in which the value of the flipping function has exceeded a first threshold value, and there is a first variable node, in which the value of the flipping function has exceeded a second threshold value smaller than the first threshold value, the group state value manager updates the first group state value as a second value.

10. The data processing device according to claim 2, wherein, in the current iteration, when there is no first variable node, in which the value of the flipping function has exceeded a second threshold value, the group state value manager maintains the first group state value.

11. The data processing device according to claim 2, wherein, in the current iteration, each of the first variable nodes determines the value of the flipping function on the basis of the number of unsatisfied check nodes, an initially inputted target bit, and the stored target bit.

12. An operating method of a controller, the operating method comprising:

providing, by each of variable nodes, a codeword bit, which is provided from a memory device, to one or more corresponding to the variable node among check nodes;

detecting, by each of the check nodes, an error of the codeword bit provided thereto;

selectively flipping, by each of the variable nodes, the codeword bit according to a group state value and a flipping function of the codeword bit;

updating the group state value according to the flipping functions of the variable nodes;

iterating the providing of the codeword bit, detecting the error of the codeword bit, selectively flipping the codeword bit, and updating the group state value for a predetermined number of times until no error is detected within the codeword bits; and providing a host with the codeword bit as an error-corrected data bit when no error is detected within the codeword bit, wherein the group state value updated in a current iteration is commonly referred by the variable nodes in a subsequent iteration, wherein, in the current iteration, each of the variable nodes selectively flips the codeword bit on the basis of (a) the group state value updated on the basis of flipping of the variable nodes in a previous iteration and (b) a number of unsatisfied check nodes determined in the current iteration, and wherein, in the current iteration, the group state value manager updates the group state value as an initial value of the group state value when at least one of the variable nodes flips the codeword bit.

13. The operating method of claim 12, wherein the codeword bit is flipped when the group state value is a first value and a value of the flipping function is greater than a first threshold value.

14. The operating method of claim 12, wherein the codeword bit is flipped when the group state value is a second value and a value of the flipping function is greater than a second threshold value.

15. The operating method of claim 12, wherein the group state value is updated as a first value when one or more have values greater than a first threshold value among the flipping functions of the variable nodes.

16. The operating method of claim 12, wherein the group state value is updated as a second value when one or more have values between first and second threshold values among the flipping functions of the variable nodes.

17. The operating method of claim 12, wherein the group state value is updated as a current value when one or more have a second threshold value or less among the flipping functions of the variable nodes.

18. The operating method of claim 12, the flipping function is represented by a following equation:

$$E2 = a21*(r \oplus c) + a22*\#UCN + a23*\#SCN, \quad \text{[Equation]}$$

wherein "E2" is a value of the flipping function, each of "a21", "a22", and "a23" represents a predetermined non-zero constant, "r" represents the codeword bit of a first iteration, "c" represents the codeword bit of the current iteration, "#UCN" represents a number of first check nodes that detect the error among the check nodes corresponding to the variable node, and "#SCN" represents a number of second check nodes other than the first check nodes among the check nodes corresponding to the variable node.

* * * * *